United States Patent
Song et al.

(10) Patent No.: US 7,595,532 B2
(45) Date of Patent: Sep. 29, 2009

(54) SEMICONDUCTOR MEMORY DEVICES AND METHODS OF FORMING THE SAME

(75) Inventors: Ki-Whan Song, Seoul (KR); Chang-Hyun Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 78 days.

(21) Appl. No.: 11/649,074

(22) Filed: Jan. 3, 2007

(65) Prior Publication Data
US 2007/0158727 A1 Jul. 12, 2007

(30) Foreign Application Priority Data
Jan. 10, 2006 (KR) .................. 10-2006-0002672

(51) Int. Cl.
H01L 27/01 (2006.01)
H01L 29/792 (2006.01)
(52) U.S. Cl. ............. 257/347; 257/314; 257/318; 257/326; 257/339; 257/402; 257/487; 257/E21.209; 257/E21.422; 257/E27.112; 365/149; 365/185.01; 365/185.15; 438/149; 438/217; 438/257
(58) Field of Classification Search ............. 257/314, 257/315, 318, 326, 327, 339, 345, 347
See application file for complete search history.

(56) References Cited
U.S. PATENT DOCUMENTS 5,929,479 A * 7/1999 Oyama ..................... 257/315
6,525,379 B2 * 2/2003 Nomoto et al. ............ 257/347
6,735,817 B2 * 5/2004 Bair et al. .................. 15/353
6,861,689 B2 3/2005 Burnett
6,934,186 B2 8/2005 Fazan et al.
7,224,002 B2 * 5/2007 Bhattacharyya ............ 257/110
7,294,881 B2 * 11/2007 Korenari et al. ............ 257/314
2004/0041206 A1 * 3/2004 Bhattacharyya ............ 257/326

FOREIGN PATENT DOCUMENTS

JP 08-213622 8/1996
JP 2003-031696 1/2003

OTHER PUBLICATIONS

Ohsawa et al., "Memory Design Using a One-Transistor Gain Cell on SOI", IEEE Journal of Solid State Circuits, vol. 37, No. 11, Nov. 2002, pp. 1510-1522.

* cited by examiner

*Primary Examiner*—Dao H Nguyen
(74) *Attorney, Agent, or Firm*—Myers Bigel Sibley & Sajovec

(57) ABSTRACT

A semiconductor memory device includes a semiconductor substrate including an insulating layer, a charge storage region of a first conductivity type on the insulating layer, and an insulating film on the insulating layer and surrounding the charge storage region. A body region of the first conductivity type is on an upper surface of the charge storage region, and a gate stack including a gate electrode and a gate insulating film is on the body region. A source region and a drain region of a second conductivity type are on opposite sides of the body region. The charge storage region extends further towards the semiconductor substrate than the source region and/or the drain region. Methods of forming semiconductor memory devices are also disclosed.

9 Claims, 5 Drawing Sheets

SEMICONDUCTOR MEMORY DEVICES AND METHODS OF FORMING THE SAME

CROSS-REFERENCE TO RELATED PATENT APPLICATION

This application claims priority under 35 USC 119 to Korean Patent Application No. 10-2006-0002672, filed on Jan. 10, 2006, in the Korean Intellectual Property Office, the disclosure of which is incorporated herein in its entirety by reference.

FIELD OF THE INVENTION

The present invention relates to semiconductor memory devices and methods of forming the same, and more particularly, to single-transistor DRAM memory devices without a capacitor and methods of forming the same.

BACKGROUND

A dynamic random access memory (DRAM) is a type of semiconductor memory device. In general, a DRAM device includes a field effect transistor that controls read/write operations and a capacitor that stores an electric charge. The integration density of DRAMs has been regularly increased by, for example, miniaturizing the field effect transistor and/or forming capacitors having a desired capacitance in smaller regions. For example, technology has been developed for forming a stack capacitor or a deep trench capacitor. However, short channel effects due to the miniaturization of the transistor and/or an increase in the manufacturing cost due to the complicated process of forming the capacitor may make it difficult to further increase the integration density of DRAMs.

Providing a single transistor DRAM cell without a capacitor or a floating body cell (FBC) formed on a semiconductor layer of a silicon-on-insulator (SOI) substrate have been proposed as possible approaches for reducing the complexity of the process of forming a DRAM cell.

FIG. 1 is a sectional view illustrating a structure of a conventional single transistor DRAM cell without a capacitor.

Referring to FIG. 1, a single transistor DRAM cell 100 includes: a substrate 15 having a silicon substrate 10 and a silicon oxide layer 20 formed on the silicon substrate 10. A P-type body region 31, an N-type source region 32, and an N-type drain region 33 are formed in a silicon layer 30 on the silicon oxide layer 20. The N-type source region 32 and the N-type drain region 33 extend through the thickness of the silicon layer 30. The P-type body region 31 is formed between the N-type source region 32 and the N-type drain region 33. The P-type body region 31 is an electrically floating region that is bounded by the silicon oxide layer 20 and its junction with the N-type source region 32 and the N-type drain region 33. A gate insulating film 50 and a gate electrode 60 are disposed on the P-type body region 31.

The P-type body region 31 of the single transistor DRAM cell 100 is capable of storing an electric charge. The single transistor DRAM cell 100 experiences a change in a current between the source/drain regions and/or a change in the threshold voltage of the device, depending on the density of excess carriers accumulated in the floating P-type body region 31. By detecting such changes, the programming state of the memory cell may be determined. Thus, the device 100 may not require a capacitor to be formed. Accordingly, it may be possible to enhance the integration density of DRAMs and/or to economically fabricate DRAMs using such a structure. However, the performance of the memory device may degrade due to short channel effects, as the channel length of the transistor is reduced.

In order to address the short channel effects due to reduced channel length of a single transistor DRAM cell, a method of increasing the impurity concentration in a channel region and a body region of a DRAM cell and decreasing the thickness of a semiconductor layer is disclosed in "Memory Design Using a One-Transistor Gain Cell on SOI" of T. Ohsawa et al., IEEE JOURNAL OF SOLID STATE CIRCUITS, Vol. 37, pp. 1510-1522, 2002. However, when the impurity concentration of the channel and the body region increases, leakage current may increase more in a junction region, thereby reducing the charge retention time of the DRAM cell. Also, the volume of a floating body decreases with the increase of the integration density, and thus the concentration of the stored excess carriers (holes or electrons) may decrease. Accordingly, the charge capacity required by a DRAM may not be obtained.

SUMMARY

A semiconductor memory device according to some embodiments of the invention includes a semiconductor substrate including an insulating layer, a charge storage region of a first conductivity type on the insulating layer, and an insulating film on the insulating layer and surrounding the charge storage region. A body region of the first conductivity type is on an upper surface of the charge storage region, and a gate stack including a gate electrode and a gate insulating film is on the body region. A source region and a drain region of a second conductivity type are on opposite sides of the body region. The charge storage region extends further towards the semiconductor substrate than the source region and/or the drain region.

The charge storage region may form a lower center portion of the body region. The charge storage region may include a single crystal semiconductor material. The semiconductor substrate may include a SOI (silicon-on-insulator) substrate.

The body region, the source region, and the drain region may be formed in an epitaxial layer grown from the charge storage region. The charge storage region may include a high-concentration impurity region of the first conductivity type. The first conductivity type may be P-type, and the second conductivity type may be N-type.

The semiconductor memory device may further include a line extending through the insulating film and the insulating layer and connected electrically to the semiconductor substrate.

Methods of fabricating a semiconductor memory device according to some embodiments of the invention include providing a semiconductor substrate including a first semiconductor layer on an insulating layer, patterning the first semiconductor layer to form a charge storage region on the insulating layer, forming an insulating film on the insulating layer and on sidewalls of the charge storage region, and forming a second semiconductor layer on an upper surface of the charge storage region. A body region of a first conductivity type is formed on the charge storage region in the second semiconductor layer, and a gate stack including a gate insulating film and a gate electrode is formed on the body region. A source region and a drain region of a second conductivity type are formed on opposite sides of the body region in the second semiconductor layer.

The methods may further include doping the charge storage region with impurities of a first conductivity type after forming the insulating film. Forming the insulating film may include depositing the insulating film on the insulating layer and the charge storage region, and removing portions of the insulating film by a chemical mechanical polishing process or etchback process until the upper surface of the charge storage region is exposed.

The first and/or second semiconductor layer may include a single crystal semiconductor layer. The second semiconductor layer may include impurities of the first conductivity type.

Forming the second semiconductor layer may include forming an epitaxial layer by a selective epitaxial growth process using the charge storage region as a seed, and defining the second semiconductor layer by patterning the epitaxial layer. The methods may further include planarizing an upper surface of the epitaxial layer. The epitaxial layer may be in-situ doped.

The methods may further include forming a line connected electrically to the semiconductor substrate.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

Figure 1:
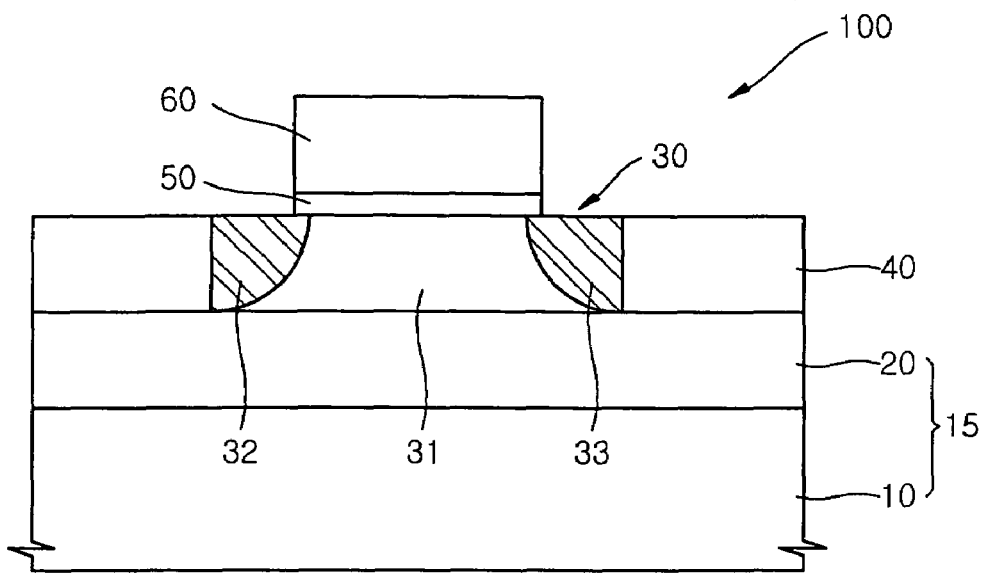
FIG. 1 is a sectional view illustrating a structure of a conventional single transistor DRAM cell having no capacitors.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted regions. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Some embodiments of the invention are described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes.

Figure 2A:
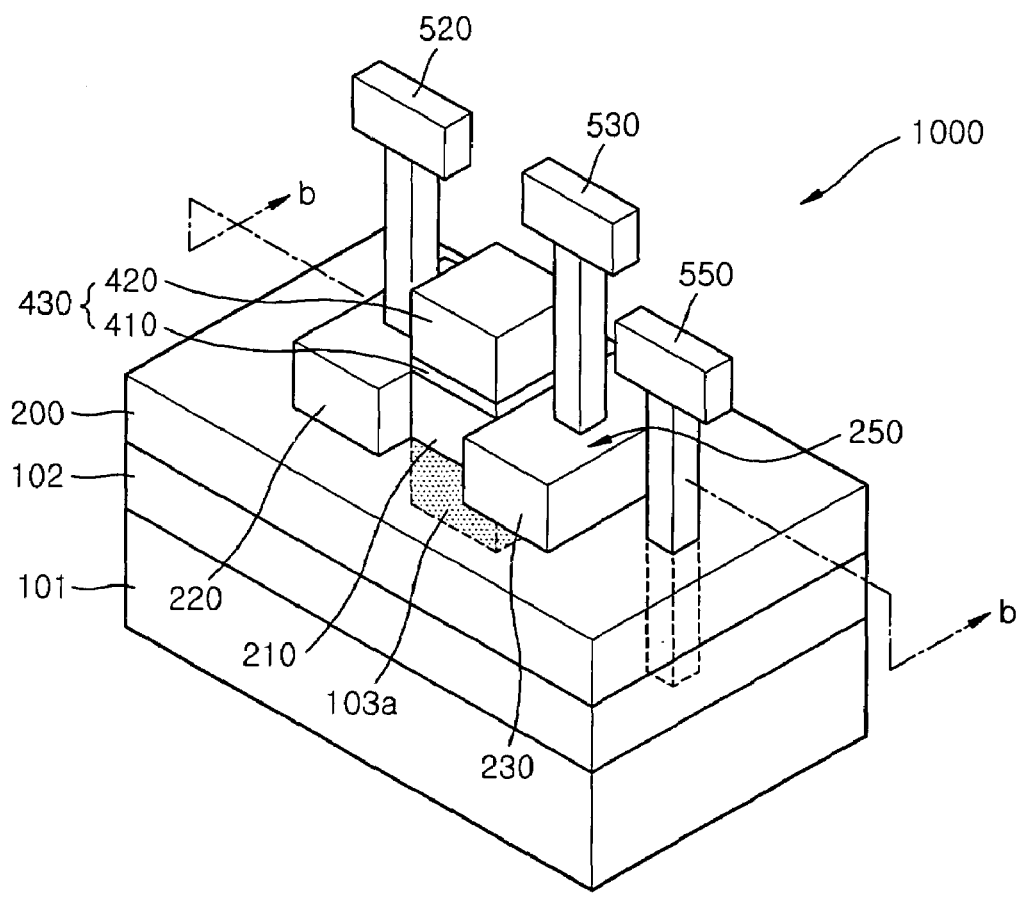
FIG. 2A is a perspective view of a single transistor memory cell according to some embodiments of the present invention.
Figure 2B:
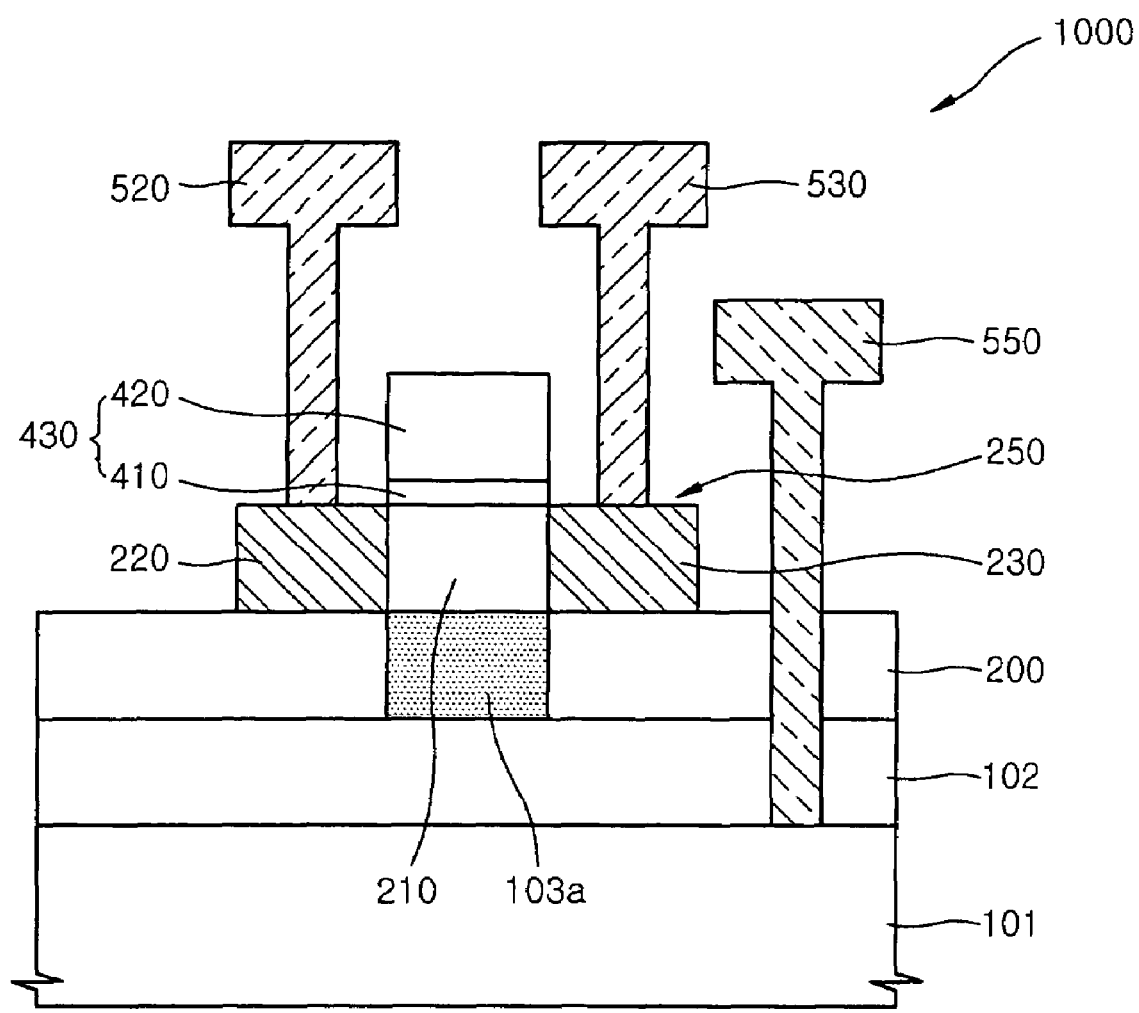
FIG. 2B is a sectional view of the single transistor memory cell of FIG. 2A taken along line b-b of FIG. 2A.

FIG. 2A is a perspective view of a single transistor memory cell according to some embodiments of the present invention, and FIG. 2B is a sectional view of a single transistor memory cell taken along line b-b of FIG. 2A.

Referring to FIGS. 2A and 2B, a single transistor memory cell 1000 includes a semiconductor substrate 101 including an insulating layer 102 formed thereon and a transistor cell on the substrate 101. The transistor cell includes a charge storage region 103a and a body region 210 of a first conductivity type on an upper surface of the charge storage region 103a. A gate stack 430 including a gate insulating film 410 and a gate electrode 420 is formed on the body region 210, and a source region 220 and a drain region 230 of a second conductivity type are spaced apart by the body region 210 and disposed adjacent each other.

The charge storage region 103a is electrically floating as a result of being insulated from the other parts of the transistor cell by an insulating layer 102 of the semiconductor substrate 101, an insulating film 200 surrounding the charge storage region 103a and exposing an upper surface of the charge storage region 103a, a built in potential barrier formed by the junction between the body region 210 of the first conductivity type and the source region 220 and the drain region 230 of the second conductivity type, and the gate insulating film 410.

Impact ionization or band-to-band tunneling (gate induced drain leakage (GIDL)) may be generated near the junction between the body region 210 and the source region 220 and/or the drain region 230, by applying a control signal to the gate electrode 420 and a bias to the source region 220 and/or the drain region 230. The floating charge storage region 103a may represent a data state of '1' or '0' depending on the charge stored therein. Charge may be stored in the charge storage region 103a by storing or discharging the electric charge generated by impact ionization and/or by GIDL. Also, the data state of the charge storage region 103a may be determined by the fact that a threshold voltage of the gate and/or a current detected in the source region 220 and/or the drain region 230 may change as the electric potential of the charge storage region 103a changes based on the amount of charge stored therein.

For example, when the body region 210 is P-type and the source region 220 and the drain region 230 are N-type, impact ionization may be caused by a hot electron near the junction (s) with the source region 220 and/or the drain region 230. The impact ionization generates an electron-hole pair, and the generated holes may be accumulated in the charge storage region 103a. The excess holes accumulated in the charge storage region 103a may be discharged to the source region 220 or the drain region 230 through the body region 210 by applying a forward bias to the junction between the body region 210 and the source region 220 or the drain region 230.

A portion of the body region 210 faces the charge storage region 103a, which thus extends further toward the semiconductor substrate 101 than those portions of the body region 210 facing the source region 220 and the drain region 230. In particular, the charge storage region 103a may contact a lower center portion of the body region 210.

The body region 210, which is extended by the floated charge storage region 103a, can increase charge storage capacity of the DRAM cell by increasing the volume of charge storage space, in comparison to a conventional single transistor memory device. Also, according to some embodiments of the present invention, since the junction portions of the source region 230 and/or the drain region 230, which are the path of a leakage current, may be small in comparison to the volume of the charge storage space, a sufficient charge retention time can be obtained.

The charge storage region 103a may be formed of a single crystal semiconductor material. Accordingly, the charge storage region 103a, the insulating layer 102, and the semiconductor substrate 101 may be provided from a silicon-on-insulator (SOI) substrate. The insulating layer 102 may be a buried oxide (BOX) layer formed by a separation by implanted oxygen (SIMOX) process and/or a bonding and layer transfer process. The insulating film 200 may be formed of an oxide by a chemical vapor deposition process.

The body region 210, the source region 220, and the drain region 230 may be formed in a single semiconductor layer that includes an active region 250, as in a general transistor. In this case, unlike the conventional single transistor DRAM, a portion of the body region 210 of the present invention may extend substantially further in a depth direction than the source region 220 and the drain region 230.

If the charge storage region 103a is formed of a single crystal semiconductor material, the single semiconductor layer from which the body region 210 and source and drain regions 220, 230 are formed may be formed, for example, by a selective epitaxial growth (SEG) process using the charge storage region 103a as a seed. The charge storage region 103a may increase the charge storage capacity of the cell 1000 by including a high-concentration impurity region of a first conductivity type. Also, the source region 220 and/or the drain region 230 may include a high-concentration impurity region.

A semiconductor memory device according to some embodiments of the present invention may further include a line 550 connected electrically to the semiconductor substrate 101 to apply a bias thereto. Capacitive charging may be induced between the semiconductor substrate 101 and the charge storage region 103a by applying a bias to the semiconductor substrate 101, such that the density of the electric charge stored in the charge storage region 103a can be increased. As a result, a charge capacity can be increased in the charge storage region 103a. Also, a discharge current of the electric charge stored in the charge storage region 103a may be increased by applying a bias of opposite polarity.

FIG. 3A through 3H are sectional views illustrating methods of forming a single transistor memory cell according to some embodiments of the present invention.

Figure 3A:
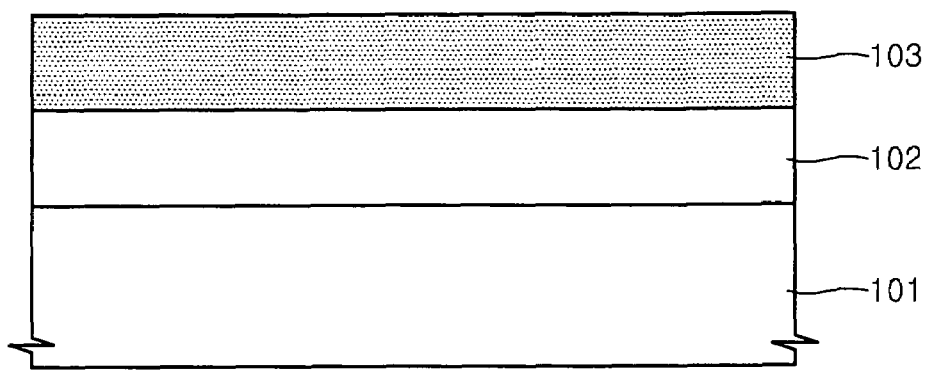
FIG. 3A through 3H are sectional views illustrating methods of fabricating single transistor memory cells according to some embodiments of the present invention.

Referring to FIG. 3A, a single transistor memory device according to some embodiments of the present invention may be formed using a semiconductor substrate 101 including a first semiconductor layer 103 formed on an insulating layer 102 on the substrate 101. The semiconductor substrate 101 may be, for example, a silicon on insulator (SOI) substrate. In order to form a first semiconductor layer 103 having a high concentration of impurities region of a first conductivity type in order to increase the charge storage capacity of a charge storage region 103a (FIG. 3B), a SOI substrate including a semiconductor layer 103 doped with a high concentration of impurities may be used. In this case, a charge storage region 103a including impurities can be formed more easily. The insulating layer 102 may be a buried oxide (BOX) layer formed, for example, by a SIMOX process and/or a bonding and layer transfer process.

Figure 3B:
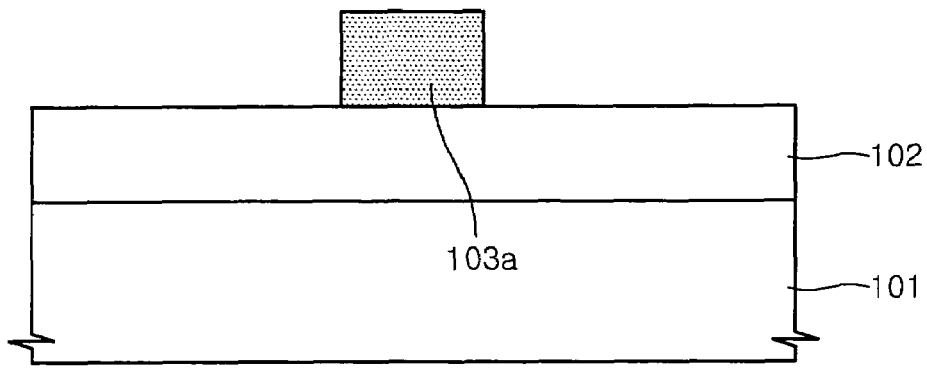

Referring to FIG. 3B, the first semiconductor layer 103 may be patterned to form a charge storage region 103a on the insulating layer 102. When the first semiconductor layer 103 is provided from the semiconductor layer of the SOI substrate, the charge storage region 103a may be formed of a single crystal semiconductor material.

Figure 3C:
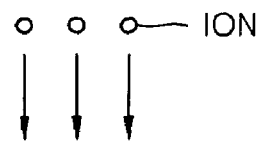
Figure 3C:
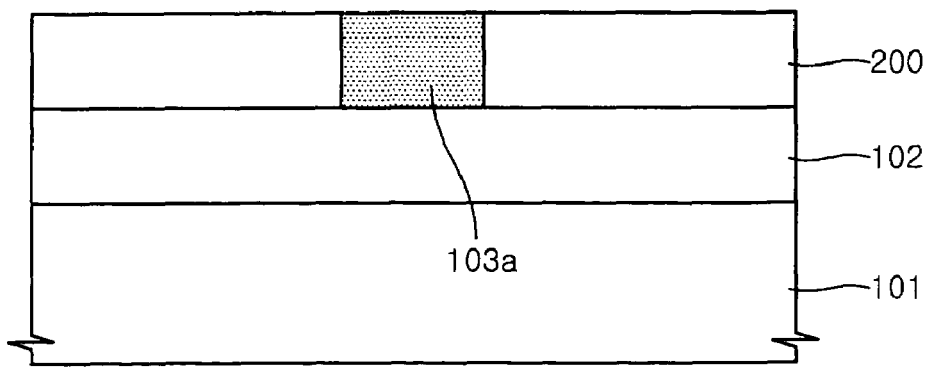

Referring to FIG. 3C, an insulating film 200 is formed on the insulating layer 102 including sidewalls of the charge storage region 103a, such that an upper surface of the charge storage region 103a is exposed. For example, the insulating film 200 may be deposited on the insulating layer 102 and the charge storage region 103a by a chemical vapor deposition process, and then the insulating film 200 may be selectively removed (i.e. thinned) by a chemical mechanical polishing process and/or an etch back process until the upper surface of the charge storage region 103a is exposed.

The surfaces of the charge storage region 103a other than the upper surface of the charge storage region 103a may be electrically insulated by the insulating film 200. If an SOI substrate including the semiconductor layer doped with high-concentration impurities is not used, a high-concentration impurity region may be formed in the charge storage region 103a by performing an ion implantation process to dope impurities of a first conductivity type into the charge storage region 103a via the exposed upper surface of the charge storage region 103a.

Figure 3D:
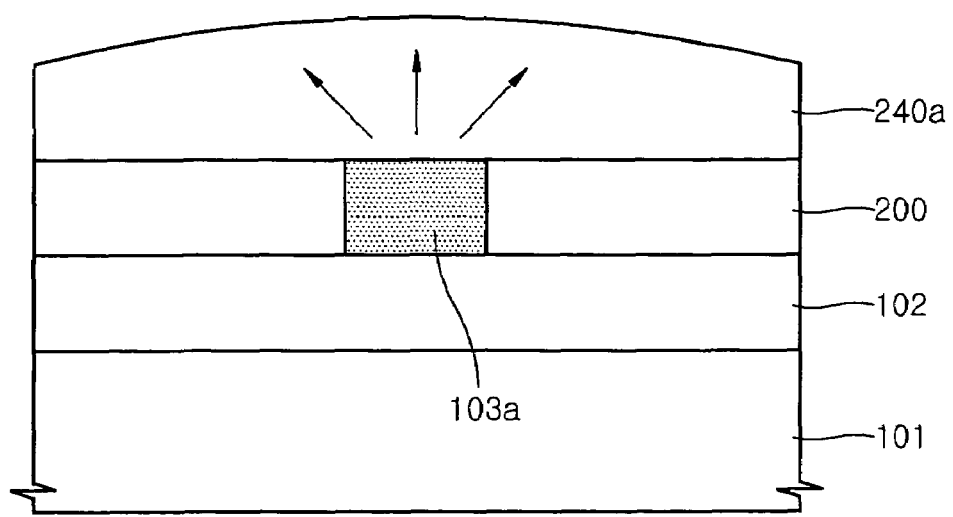
Figure 3E:
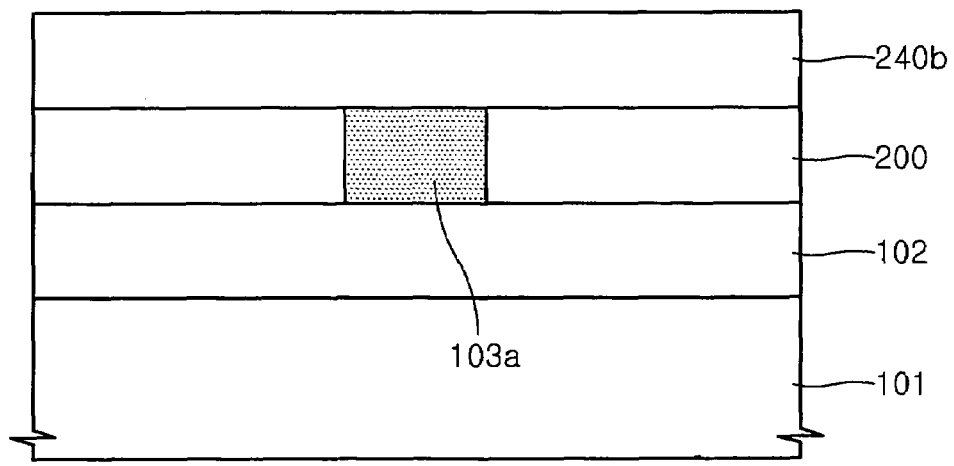
Figure 3F:
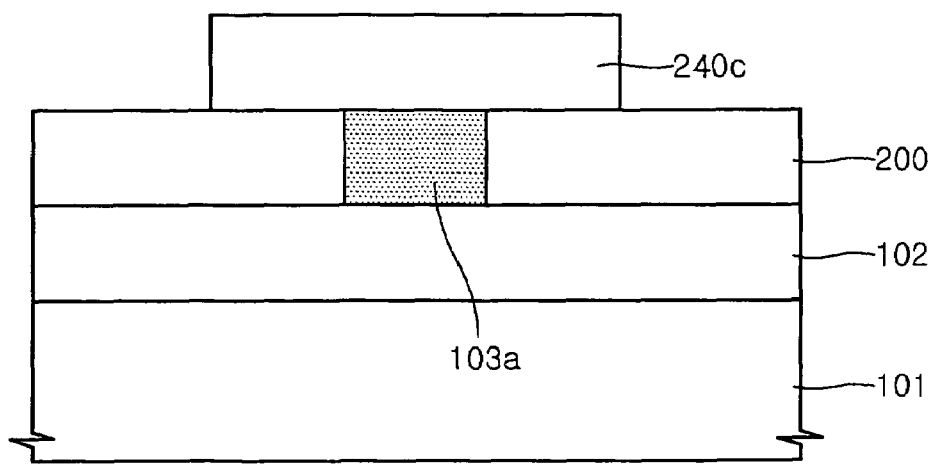

Referring to FIG. 3D through 3F, a second semiconductor layer 240c is formed on the insulating film 200 and the charge storage region 103a. The second semiconductor layer 240c may be a single semiconductor layer for providing an active region in which a body region 210, a source region 220, and a drain region 230 may be formed. A central portion of the body region 210 may contact the charge storage region 210 of the body region 103a, which extends vertically below a portion of the body region 103a where the source region 220 and the drain region 230 are formed.

If the charge storage region 103a is formed of a single crystal material, the second semiconductor layer 240c may be formed by forming an epitaxial layer 240a by a selective epitaxial growth (SEG) process using the charge storage region 103a as a seed and patterning the epitaxial layer 240a. A chemical mechanical polishing process may be further performed on an upper surface of the epitaxial layer 240a to form a planarized epitaxial layer 240b.

As illustrated in FIG. 2A, the epitaxial layer 240a (or the planarized epitaxial layer 240b) may be patterned to form an active region 250 having a larger width in regions corresponding to the source/drain regions 220, 230 than the region above the charge storage region 103a, so that the source region 220 and the drain region 230 can extend sideways from the body region 210. The body region 210 faces the charge storage region 103a and has a first conductivity type.

The epitaxial layer 240a may be deposited through a chemical vapor deposition process using a silicon-containing gas including, for example, $SiH_4$, $Si_2H_4$, $Si_2H_6$, or $SiH_2Cl_2$ and a gas containing group III impurities such as $B_2H_5$ as a doping gas, such that the epitaxial layer 240a may be in-situ doped to include P-type impurities. Thus, the body region 210 may be doped with P-type impurities. Alternatively, the impurity doping may be performed by an ion implantation process after forming the planarized epitaxial layer 240b or the second semiconductor layer 240c.

Figure 3G:
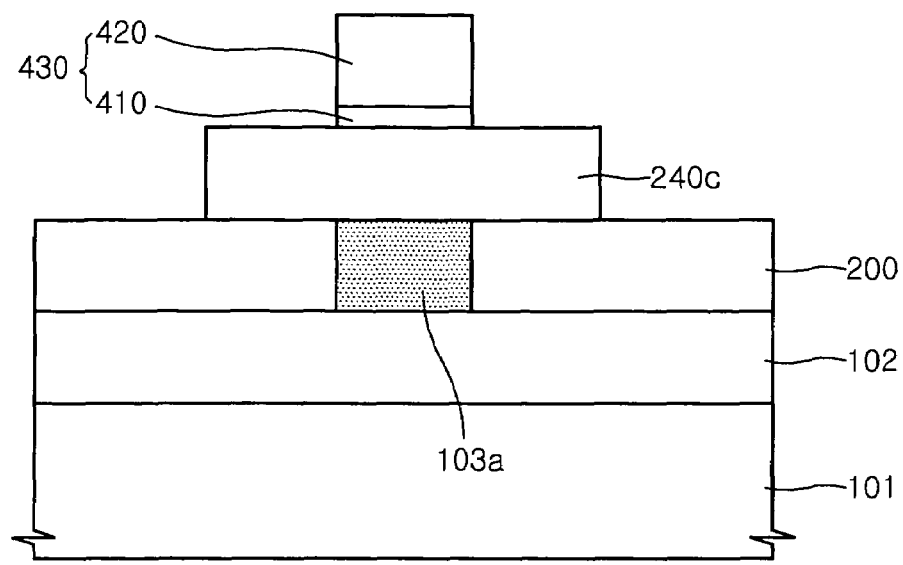

Referring to FIG. 3G, a gate stack 430 including a gate insulating film 410 and a gate electrode 420 may be formed on the body region 210. Thereafter, spacers (not shown) may be formed on opposing sidewalls of the gate stack 430.

Figure 3H:
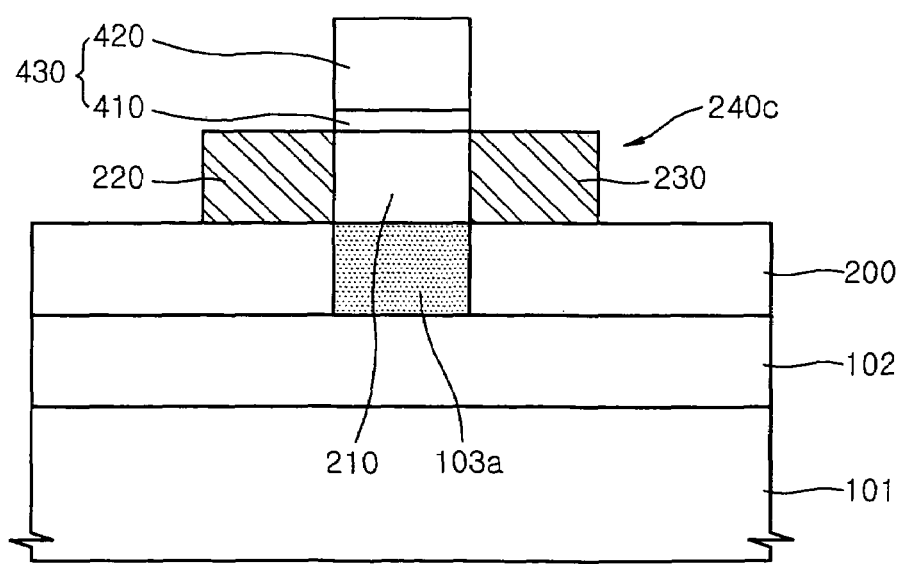

Referring to FIG. 3H, using the gate stack 430 and/or the spacers (not shown) as a mask, portions spaced apart by the body region 210 in the second semiconductor layer 240c may be doped with impurities of a second conductivity type, thereby forming the source region 220 and the drain region 230. The source region 220 and the drain region 230 may include high-concentration impurity regions of the second conductivity type, for example, N type.

Thereafter, as illustrated in FIGS. 2A and 2B, the single transistor memory device 1000 can be fabricated, for example, by electrically connecting the source region 220 and/or the drain region 230 to a bitline through contacts 520 and 530 and electrically connecting the gate electrode 420 to a wordline. The line 550 electrically connected to the semiconductor substrate 101 may be further formed to apply a bias inducing a capacitive coupling between the semiconductor substrate 101 and the charge storage region 103a.

As described above, a semiconductor memory device according to some embodiments of the present invention may include a body region 210 extended by the floated charge storage region 103a, thereby increasing the volume of charge storage space in comparison to a conventional single transistor memory device, and consequently potentially increasing the charge storage capacity. In addition, since the junction region of the source region 220 and/or the drain region 230, which is the path of a leakage current, may be small in comparison to the volume of the charge storage space, charge retention by the DRAM cell can potentially be increased.

Methods of fabricating a semiconductor memory device according to some embodiments of the present invention include forming a body region 210 extended by a floating charge storage region 103a. Accordingly, some conventional processes of forming a capacitor with a complicated structure may be avoided, and an increase in leakage current due to an increase in the integration density of a memory device and decrease in charge capacity due to a decrease in the volume of a body region may be reduced and/or avoided. Accordingly, some embodiments of the invention may provide a semiconductor memory device having better efficiency and/or performance.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A semiconductor memory device comprising:
a semiconductor substrate including an insulating layer;
a charge storage region of a first conductivity type on the insulating layer;
an insulating film on the insulating layer and surrounding the charge storage region while exposing at least part of an upper surface of the charge storage region;
a body region of the first conductivity type contacting the at least part of the upper surface of the charge storage region;
a gate stack including a gate electrode and a gate insulating film on the body region; and
a source region and a drain region of a second conductivity type on opposite sides of the body region, wherein the charge storage region extends further towards the semiconductor substrate than the source region and/or the drain region;
wherein the body region, the source region and the drain region are formed in a single semiconductor layer and the single semiconductor layer is on the charge storage region and extends over the insulating film so that the source region and the drain region are disposed over the insulating film.

2. The semiconductor memory device of claim 1, wherein the charge storage region forms a lower center portion of the body region.

3. The semiconductor memory device of claim 1, wherein the charge storage region comprises a single crystal semiconductor material.

4. The semiconductor memory device of claim 3, wherein the semiconductor substrate including the charge storage region and the insulating layer comprises a SOI (silicon-on-insulator) substrate.

5. The semiconductor memory device of claim 1, wherein the body region, the source region, and the drain region are formed in an epitaxial layer grown from the charge storage region.

6. The semiconductor memory device of claim 1, wherein the charge storage region includes a high-concentration impurity region of the first conductivity type.

7. The semiconductor memory device of claim 1, wherein the first conductivity type is P-type, and the second conductivity type is N-type.

8. The semiconductor memory device of claim 1, further comprising a conductive line extending through the insulating film and the insulating layer and connected electrically to the semiconductor substrate.

9. A semiconductor device comprising:

a semiconductor substrate including an insulating layer;

a charge storage region of a first conductivity type on the insulating layer, wherein the insulating layer surrounds an outer surface of the charge storage region except at least part of an upper surface of the charge storage region;

a body region of the first conductivity type contacting the at least part of the upper surface of the charge storage region;

a gate stack including a gate electrode and a gate insulating film on the body region; and a source region and a drain region of a second conductivity type spaced apart by the body region;

wherein the charge storage region extends further towards the semiconductor substrate than the source region and/or the drain region;

wherein the body region, the source region and the drain region are formed in a single semiconductor layer and the single semiconductor layer is on the charge storage region and extends over the insulating film so that the source region and the drain region are disposed over the insulating film.

* * * * *